US011280849B2

(12) United States Patent
Fallet et al.

(10) Patent No.: US 11,280,849 B2
(45) Date of Patent: Mar. 22, 2022

(54) METHOD FOR MEASURING AN IMPEDANCE OF AN ELECTRIC CABLE, A COUPLER ARRANGEMENT AND USES THEREOF

(71) Applicant: Wirescan AS, Trollåsen (NO)

(72) Inventors: Truls Fallet, Oslo (NO); Sigbjørn Kolberg, Oslo (NO)

(73) Assignee: WIRESCAN AS, Trollåsen (NO)

( * ) Notice: Subject to any disclaimer, the term of this patent is extended or adjusted under 35 U.S.C. 154(b) by 7 days.

(21) Appl. No.: 16/468,891

(22) PCT Filed: Dec. 13, 2017

(86) PCT No.: PCT/NO2017/050323
§ 371 (c)(1),
(2) Date: Jun. 12, 2019

(87) PCT Pub. No.: WO2018/111115
PCT Pub. Date: Jun. 21, 2018

(65) Prior Publication Data
US 2019/0369152 A1 Dec. 5, 2019

(30) Foreign Application Priority Data
Dec. 15, 2016 (NO) .................................. 20161993

(51) Int. Cl.
*G01R 31/58* (2020.01)
*G01R 27/16* (2006.01)

(52) U.S. Cl.
CPC ............. *G01R 31/58* (2020.01); *G01R 27/16* (2013.01)

(58) Field of Classification Search
CPC ..... G01R 31/58; G01R 31/1272; G01R 15/20; G01R 15/183; G01R 15/16; G01R 15/142
See application file for complete search history.

(56) References Cited

U.S. PATENT DOCUMENTS

| 4,307,267 A | 12/1981 | Peoples |
| 4,630,228 A | 12/1986 | Tarczy-Hornoch et al. |

(Continued)

FOREIGN PATENT DOCUMENTS

| CN | 104050748 | 9/2014 |
| CN | 104937427 | 9/2015 |

(Continued)

OTHER PUBLICATIONS

International Search Report dated Mar. 15, 2018 in corresponding International Application No. PCT/NO17/050323.
(Continued)

*Primary Examiner* — Dominic E Hawkins
(74) *Attorney, Agent, or Firm* — Wenderoth, Lind & Ponack, L.L.P.

(57) ABSTRACT

The invention relates to a method for cable condition monitoring of an electric cable. The method comprises inducing a test current in the electric cable, measuring a resulting current in a measurement point of the electric cable by measuring a magnetic nearfield of the electric cable, measuring a resulting voltage in the measurement point of the electric cable by measuring an electric nearfield of the cable, calculating an impedance of the electric cable based on the resulting current and the resulting voltage by a line resonance analysis system, and analysing the impedance by the line resonance analysis system establishing a condition of the electric cable. A coupler arrangement providing a non-galvanic connection to the cable is also disclosed.

30 Claims, 9 Drawing Sheets

(56) References Cited

U.S. PATENT DOCUMENTS

| | | | |
|---|---|---|---|
| 5,378,992 A | 1/1995 | Murphy | |
| 5,391,991 A | 2/1995 | Tuttle | |
| 5,473,244 A * | 12/1995 | Libove | G01R 1/22 324/126 |
| 6,184,672 B1 | 2/2001 | Berkcan | |
| 6,225,810 B1 | 5/2001 | Godo et al. | |
| 6,601,001 B1 | 7/2003 | Moore | |
| 7,519,793 B2 | 4/2009 | Abdelilah et al. | |
| 7,902,812 B2 | 3/2011 | Kojovic | |
| 7,966,137 B2 | 6/2011 | Fantoni | |
| 8,395,372 B2 * | 3/2013 | Harlev | G01R 1/071 324/96 |
| 2004/0039976 A1 | 2/2004 | Gunther et al. | |
| 2005/0057259 A1 | 3/2005 | Hornsby et al. | |
| 2005/0194978 A1 | 9/2005 | Smith | |
| 2009/0228222 A1 * | 9/2009 | Fantoni | G01R 31/58 702/59 |
| 2011/0181295 A1 | 7/2011 | Haugen et al. | |
| 2012/0215469 A1 * | 8/2012 | Serra | G01R 27/2694 702/61 |
| 2015/0253370 A1 * | 9/2015 | Fantoni | G01R 31/14 702/58 |
| 2016/0245845 A1 | 8/2016 | Alberto | |
| 2017/0052222 A1 * | 2/2017 | Pasdar | H02H 1/003 |
| 2017/0102415 A1 * | 4/2017 | Sarchi | G01R 15/246 |

FOREIGN PATENT DOCUMENTS

| | | |
|---|---|---|
| DE | 601 28 803 | 1/2008 |
| EP | 0 375 375 | 6/1990 |
| EP | 0 936 469 | 8/1999 |
| EP | 1 345 033 | 9/2003 |
| EP | 2 221 626 | 8/2010 |
| EP | 2 385 382 | 11/2011 |
| EP | 2 482 090 | 8/2012 |
| EP | 2 829 846 | 1/2015 |
| FR | 2 710 156 | 3/1995 |
| FR | 2 928 740 | 9/2009 |
| GB | 932704 | 7/1963 |
| GB | 2 345 810 | 7/2000 |
| JP | 54-2780 | 1/1979 |
| JP | 6-153423 | 5/1994 |
| JP | 2002-508520 | 3/2002 |
| JP | 2007-506091 | 3/2007 |
| JP | 2011-80896 | 4/2011 |
| RU | 2 275 645 | 4/2006 |
| RU | 2 313 799 | 12/2007 |
| WO | 98/20658 | 5/1998 |
| WO | 99/31520 | 6/1999 |
| WO | 2005/026750 | 3/2005 |
| WO | 2014/065674 | 5/2014 |
| WO | 2015/044972 | 5/2015 |

OTHER PUBLICATIONS

Norwegian Search Report dated Mar. 27, 2017 in corresponding Norwegian Application No. 20161993.
Boggs S., "The Case for Frequency Domain PD Testing in the Context of Distribution Cable", IEEE Electrical Insulation Magazine, IEEE Service Center, New York, NY, US, vol. 19, No. 4, Jul. 2003, pp. 13-19, XP011100364.
Extended European Search Report dated Aug. 17, 2020 in corresponding European Patent Application No. 17880709.5.
Office Action dated May 14, 2021 in Chinese Patent Application No. 201780077467.8, with English-language translation.
Office Action dated Apr. 30, 2021 in Russian Patent Application No. 2019121920/28, with English-language translation.
Notice of Reasons for Rejection dated Dec. 2, 2021 in Japanese Patent Application No. 2019-532764 with English translation.

* cited by examiner

METHOD FOR MEASURING AN IMPEDANCE OF AN ELECTRIC CABLE, A COUPLER ARRANGEMENT AND USES THEREOF

INTRODUCTION

The present invention concerns a method and a coupler arrangement for non-galvanic monitoring of an electric cable as well as uses of the invention. The measurements may be performed on disconnected as well as live cables.

BACKGROUND

Electric cables, both power and signal cables, are used in power generation, distribution and transmission, as cables in process industries, in aerospace industry, and onshore, offshore and subsea installations.

The cable insulation of electric cables will deteriorate over time. The degradation rate of the cable insulation increases due to harsh environment conditions as high temperature, humidity and radiation. The cable insulation material may also be degraded locally due to mechanical effects or local abnormal environment conditions. Such global and local degradation of cable insulation and also power line breakage occur in all kinds of electric cables both for power and signal use.

A number of cable fail detection techniques exist for detecting and monitoring insulation degradation and line breakage in electric cables. Examples are Partial Discharge (PD) analysis which must be used online with full voltage on the line, Time Domain Reflectometry (TDR), Spread Spectrum TDR (SSTDR), Conductor Resistance (CR) and Insulation Resistance (IR). Some methods are based on transmission line theory and try to localize local cable failures (no global degradation assessment is possible) by measuring the cable voltage as a function of time and evaluating the time delay from the incident wave to the reflected wave from the error point.

Examples of methods based on transmission line theory are found in U.S. Pat. Nos. 4,307,267 and 4,630,228, and in US publications 2004/0039976 and 2005/0057259.

Another example based on transmission line theory is found in U.S. Pat. No. 7,966,137 B2 and WO 2014/065674 A1, and is based on line resonance analysis (LIRA) providing condition monitoring and real-time diagnosis of the electric cables. In order to monitor the condition of the electric cable, these systems are connected to a free end of the electric cable in order to send signals into the cable and measure the reflected signal. The LIRA method measures the voltage V(d) of the electric cable and the corresponding current I(d) flowing into the electric cable. The line impedance $Z_d$ (which is a complex variable) for a cable measured a distance d from the cable termination end is:

$$Z_d = \frac{V(d)}{I(d)}$$

This impedance is strongly frequency dependent and based on the resonance frequencies observed, the cable condition is analyzed.

So far, monitoring has only been performed on disconnected cables by direct galvanic connection to the cable through the cable termination end. Disconnecting the cable is not desirable as this involves additional work with disconnecting and connecting, and may include shutting down entire power systems. These procedures are costly and time consuming. In critical applications, such as nuclear power plants and power distribution lines, shutting down the system may also involve undesirable risks. This also have the effect that such critical electric cables are not condition monitored as often as desirable. Many systems would therefore benefit from the possibility of continuous monitoring of cable defects and potential critical cable failure.

SUMMARY OF THE INVENTION

The invention provides a method and a coupler arrangement for non-galvanic monitoring of an electric cable.

The invention provides a method for cable condition monitoring of an electric cable, the method comprising: inducing a test current in the electric cable; measuring a resulting current in a measurement point of the electric cable by measuring a magnetic nearfield of the electric cable; measuring a resulting voltage in the measurement point of the electric cable by measuring an electric nearfield of the cable. An impedance of the electric cable may be calculated based on the resulting current and the resulting voltage by a line resonance analysis system. The impedance may be analysed by the line resonance analysis system establishing a condition of the electric cable.

The electric nearfield may be measured by a capacitive sensor. The magnetic nearfield may be measured by an inductive sensor. The inductive sensor may be shielded from the electric nearfield of the electric cable. Shielding increases the sensitivity of the measurement. Alternatively, the magnetic nearfield may be measured by using a solid-state sensor. The sensor for measuring the magnetic nearfield may be a remotely arranged sensor.

The method may further comprise synchronously detecting the output from the inductive sensor and the output from the capacitive sensor. The output from the inductive sensor and the output from the capacitive sensor may be filtered for the power line frequency of the electric cable, before performing amplification and synchronous detection. The method may further comprise amplifying the output from the inductive sensor and the output from the capacitive sensor before performing synchronous detection.

The method may further include using an inductive coupler or a capacitive coupler for inducing a test current in the electric cable.

The inductive sensor and the capacitive sensor may be clamped to the electric cable.

The condition of the electric cable may be established based on the measured resulting current and the measured resulting voltage. A complex impedance of the electric cable may be calculated based on the measured resulting current and the measured resulting voltage.

The electric cable may be a powered (live) or unpowered electric cable.

The invention further provides a coupler arrangement for electric cable condition monitoring, the coupler arrangement comprising: a first sensor for measuring a current in a measurement point of the electric cable by measuring a magnetic nearfield of the electric cable; a second sensor for measuring a voltage in the measurement point of the electric cable by measuring an electric nearfield of the electric cable.

The coupler arrangement is adapted to connect an electric cable condition monitoring system to an electric cable to be monitored, where the electric cable condition monitoring system is a line resonance analysis system based on impedance measurements of the electric cable.

The first sensor may be an inductive sensor. The inductive sensor may comprise a transformer. The first sensor may be electrically shielded from the electric nearfield of the electric cable. The inductive sensor may comprise a static screen electrically shielding the inductive sensor from the electric nearfield of the electric cable. The second sensor may be a capacitive sensor. The capacitive sensor may include an insulated capacitor electrode. The capacitor electrode may be designed to avoid local partial discharges. The insulated capacitor electrode may be adapted for contact with the electric cable insulation in at least a part of a circumference of the electric cable. The first sensor may be arranged at a distance from the electric cable.

The coupler may further comprise a signal coupler for inducing a test current in the electric cable. The signal coupler may be an inductive coupler or a capacitive coupler.

The coupler arrangement may further be adapted for clamping to the electric cable. An inside of the coupler arrangement may be adapted for contact with the cable insulation or a semi-conductive layer on the cable insulation.

The coupler arrangement may be used for connecting a cable condition monitoring device to an electric cable. The cable monitoring device may be a cable fail analysis device. The cable monitoring device may be a line resonance analysis system based on impedance measurements of the electric cable.

The method above or the coupler arrangement above may be used for measuring noise from an electric cable.

The invention further provides a method for measuring an impedance of an electric cable, the method comprising detecting a nearfield of the electric cable by use of a non-galvanic connection to the electric cable. An impedance of the electric cable is calculated based on the detected nearfields of the electric cable.

The invention provides a method and coupler arrangement for monitoring a condition of an electric cable. Errors and deterioration of an electric cable may be monitored by measuring the electromagnetic nearfield caused by a test current induced in the cable. The invention also provides a method for measuring an impedance of an electric cable by detecting an electromagnetic nearfield of the electric cable by use of a non-galvanic connection to the cable. The method and coupler arrangement enables non-galvanic measurement of the complex line impedance in a freely chosen point on an electric cable.

The methods above are based on detecting the electromagnetic nearfield of the electric cable using the magnetic nearfield to measure the current and the electric nearfield to measure the line voltage. The method is in its nature non-galvanic as the electric and magnetic fields propagate freely through the cable insulation. The measurements may be performed on disconnected (unpowered) cables as well as live cables. The coupler arrangement may be used to connect cable monitoring systems to live electric cables for analyzing the cable condition without the need for any direct galvanic connection to the electric cable. The coupler arrangement may be designed for installation on the electric cable under full line power. For high voltage power systems this may typically be several kV and hundreds of amperes. The invention enables condition monitoring of the electric cable without shutting down the power system and enables cost efficient failure analysis of an electric cable under full operating voltage and current. The invention also opens for a wider use of the LIRA (Line Resonance Analysis) method and system. The invention also opens for Partial Discharge (PD) measurements on a live electric cable as the method and coupler arrangement enable full spectrum analysis of the current and voltage noise on the cable under full power conditions.

BRIEF DESCRIPTION OF DRAWINGS

Example embodiments of the invention will now be described with reference to the followings drawings, where:

FIG. 4a is an example embodiment of a coupler arrangement clamped around an electric cable;

FIG. 4b is a longitudinal sectional view of the coupler arrangement from FIG. 4a;

FIGS. 6a-6d illustrate example embodiments of coupler arrangements connected to a commercially available high voltage cable connector; where

DETAILED DESCRIPTION

The present invention will now be described with reference to the drawings.

Figure 1:
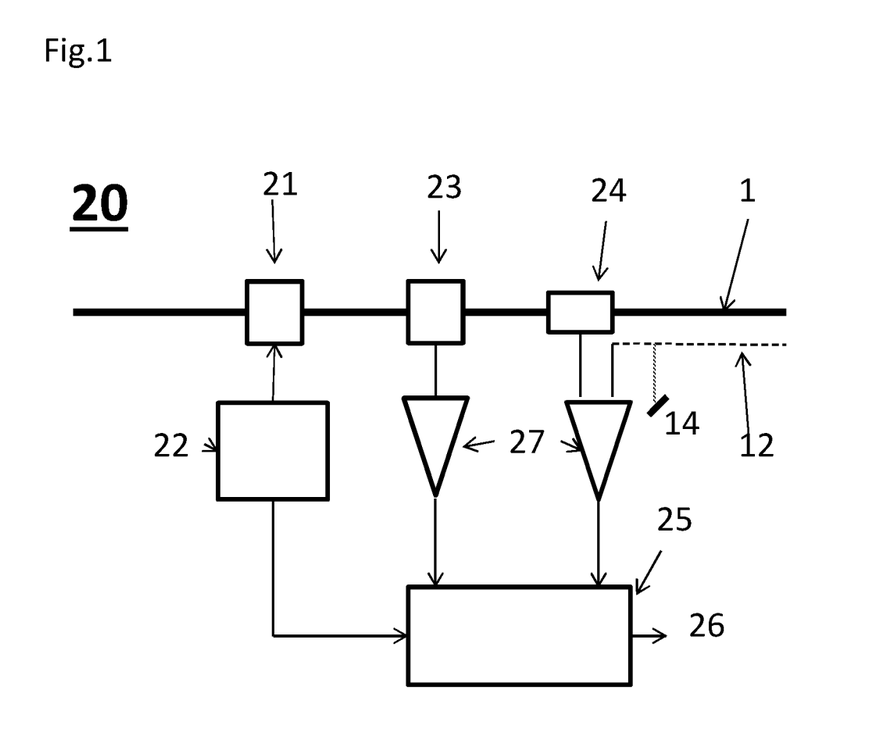
FIG. 1 illustrates a coupler arrangement for electric cable monitoring.
Figure 2:
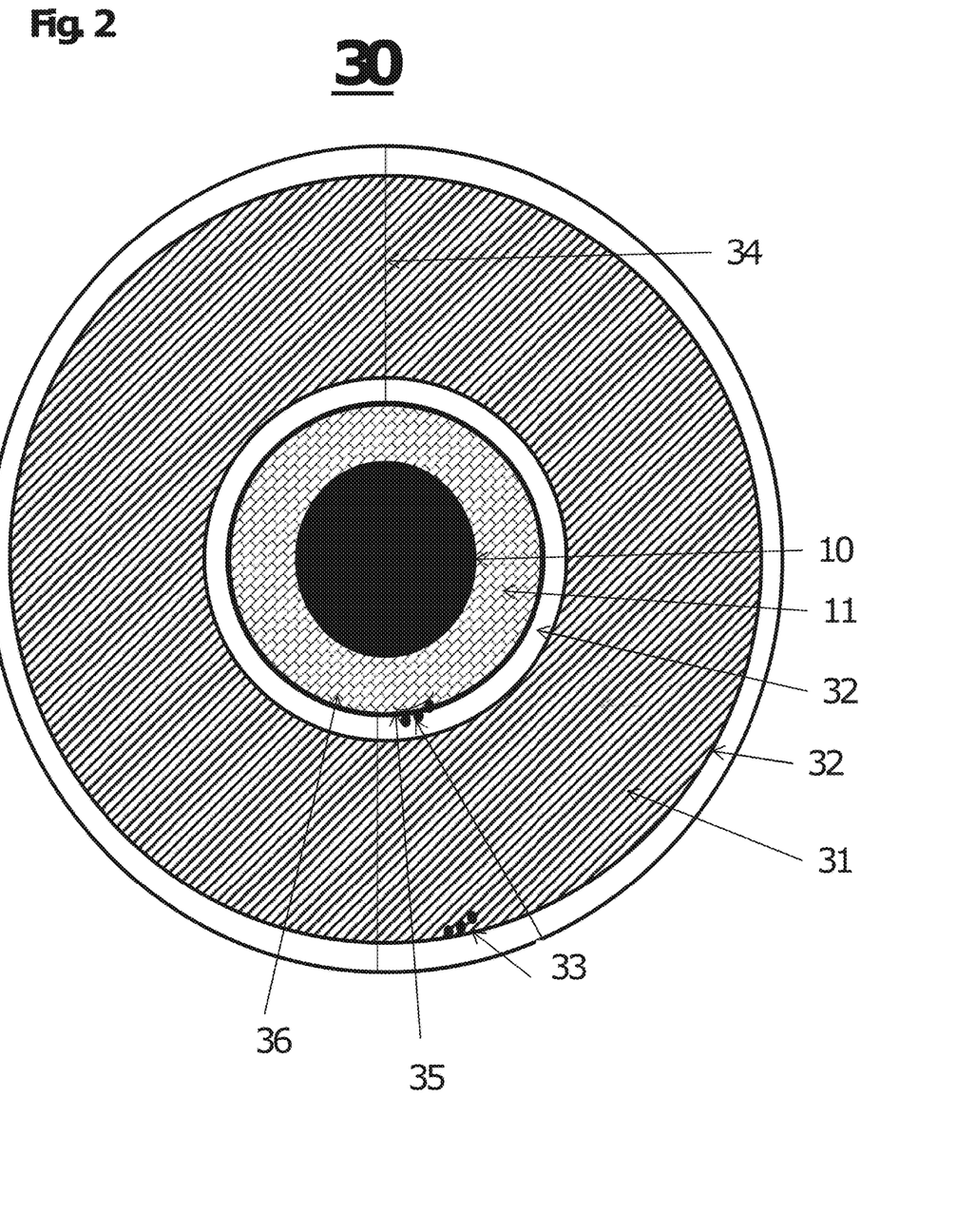
FIG. 2 is a schematic view of a cross section of an embodiment of an inductive coupler.

FIG. 1 illustrates a coupling arrangement 20 for electric cable monitoring connected to an electric cable 1 (power line or signal cable). The power line 1 under test in FIG. 1 has an insulating layer (not shown). The insulation may include a semi-conductive outer layer 36 (FIG. 2). A possible outer sheath and a cable screen 12 of the cable 1 are removed to expose the cable insulation 11 in the measurement area of the coupling arrangement 20. The measurement area is a freely chosen point on the cable. The cable screen 12 is connected to a common earth with the electronic monitoring system (22, 27, 25). The electric cable 1 may be a powered (live) or unpowered electric cable. The coupling arrangement in FIG. 1 comprises a signal coupler 21, a current sensor 23 and a cable voltage sensor 24. The signal coupler 21 may be an inductive coupler or a capacitive coupler for inducing a test signal in the electric cable. The test signal travels through the electric cable under influence of the cable condition. The cable condition is monitored by measuring the current and voltage in the cable resulting from the induced test signal, in a measurement point on the cable. The current and voltage generate an electromagnetic nearfield around the electric cable. The voltage is measured by sensing the electric nearfield and the current is measured by sensing the magnetic nearfield of the electric cable. Measurement of the electromagnetic nearfield around the cable enable a non-galvanic connection to the electric cable.

The signal coupler 21 may be arranged separately from the current sensor 23 and voltage sensor 24 and the test signal may be induced in a different location on the cable. The signal coupler 21 may thus be a separate component and not part of the coupler arrangement 20. The current sensor 23 may be an inductive sensor measuring the resulting current in a measurement point of the electric cable by measuring the magnetic nearfield of the cable. The magnetic nearfield of the electric cable may also be measured by a solid-state sensor. The solid-state sensor may typically be a Hall-element. The sensor for measuring the magnetic nearfield may be arranged at a distance from the electric cable. The possible measuring distance depends upon the magnetic nearfield strength. The voltage sensor 24 may be a capacitive sensor measuring the voltage between the centre conductor and the screen in the measurement point. The cable screen 12 of the electric cable 1 is connected to common ground 14. The electronics is connected to common ground 14.

The impedance of an electric cable in a specific measurement point may be measured by inducing a test current in the electric cable and measuring the resulting current and resulting voltage in the measurement point as explained above. The measurement point in this context has some extension along the cable length depending on the cable dimensions and transmission voltage in the cable. The sensors 23, 24 for measurement of the resulting current and the resulting voltage, respectively, should be positioned close to each other and their positions together define the measurement point on the cable. The size of the measurement point may vary from several meters for a very long high voltage cable and down to a few mm for a short low voltage signal cable application.

The signals from the current sensor 23 and the voltage sensor 24 are fed into an electronic detection system. The electronic detection system includes a synchronous detector 25. The synchronous detector 25 separates the signals into in-phase and quadrature parts for each of the current sensor and voltage sensor signals. The synchronous detector receives its frequency and phase reference for the measurements from the signal source 22 driving the signal coupler 21. The outputs from the synchronous detector are transmitted to a computer 26 for further analyses. The computer may calculate the complex cable impedance based on the measured current and voltage signals. The complex cable impedance may be used for analysing the condition of the electric cable 1.

A number of cable monitoring systems may be connected to a live power cable by the use of the coupling arrangement illustrated in FIG. 1. An example is the line resonance analysis system (LIRA) as described in detail in U.S. Pat. No. 7,966,137 B2 and WO 2014/065674 A1. As illustrated in FIG. 1, the signals from the signal source (generator), the current sensor and the cable voltage sensor are fed to a synchronous detector and digitized before being fed to a computer for further analysis. The computer may be a LIRA system which is described in detail in U.S. Pat. No. 7,966, 137 B2 and WO 2014/065674 A1, which publications are hereby incorporated by reference. The method and coupler arrangement may also be used together with monitoring systems analysing the cable condition based on Partial Discharge (PD) measurements.

An embodiment of an inductive coupler 30 comprising a transformer is illustrated in FIG. 2. The inductive coupler is based on a toroid transformer provided with a core material 31. The core material 31 may be a ferromagnetic core material or air. The toroid transformer is split in two, and these two parts may be two halves. An airgap 34 filled with a non-magnetic isolating material is provided between the two parts. A coil 33 is at least partly wound around one of the two toroid halves. In FIG. 2, the coil has three turns, but may be provided with further turns or fewer turns. The core material and number of turns may vary depending on the design and use of the coupler. Protective insulation 32 is provided both on the outside and on the inside of the ferromagnetic core 31. The protective insulation 32 also covers the coil 33. The inductive coupler may be used for inducing a test signal in the electric cable. The electric cable conductor 10 in FIG. 2 is provided with a cable insulation 11 further provided with a semi-conductive layer 36.

The inductive coupler in FIG. 2 may also be used as the sensor for measuring the magnetic nearfield around the electric cable, and thus as the sensor for measuring the current in the electric cable. However, when used as a sensor for measuring a current, the coil 33 may be electrically shielded 35 from the electric nearfield of the electric cable 10. The shield in FIG. 2 is provided by a static screen 35. The static screen 35 is provided inside the protective insulation 32 on the inside of the ferromagnetic core 31. The static screen 35 covers a sector area larger than the sector area covered by the coil 33. By shielding the inductive sensor from the electric nearfield of the electric cable, the sensitivity of the inductive sensor, which measures the magnetic nearfield of the cable, is increased.

Figure 3:
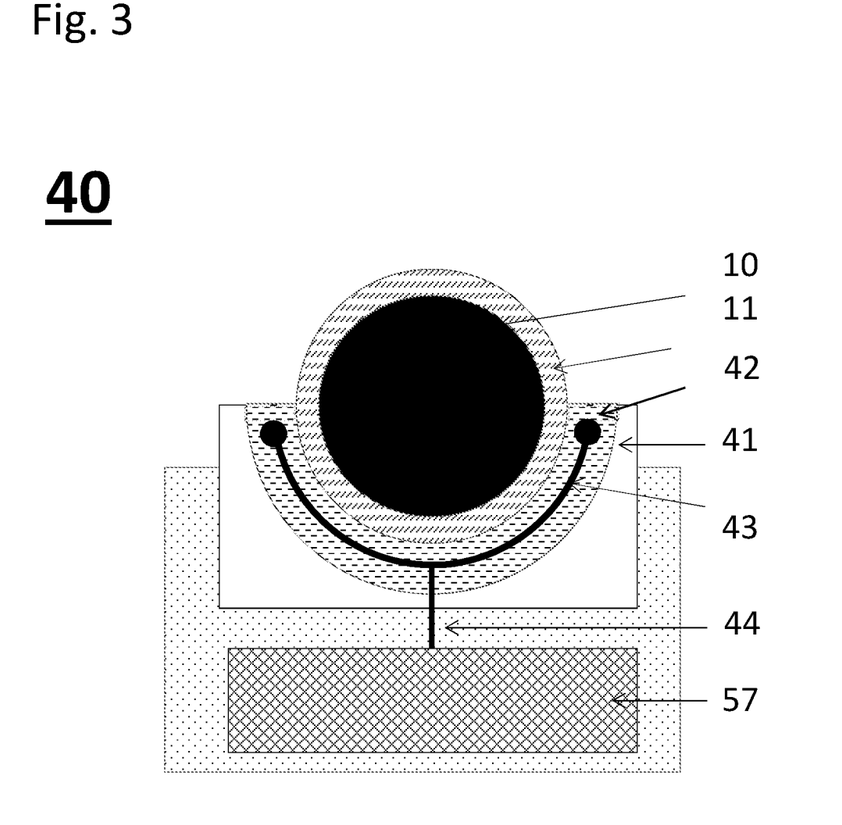
FIG. 3 is a schematic view of a cross section of an embodiment of a capacitive coupler.

FIG. 3 illustrates an embodiment of a voltage sensor in the form of a capacitive coupler 40 for measuring the line voltage from the electric nearfield close to the electric cable insulation 11. In the embodiment in FIG. 3, the capacitive coupler comprises an insulated 42 capacitor electrode 43. The capacitive coupler is adapted for contact with the electric cable in at least a part of a circumference of the power line. The capacitor coupler comprises an insulated hemi-cylindrical metal plate 43. In the embodiment in FIG. 3, this insulated hemi-cylindrical metal plate is pressed towards the electric cable insulation 11 and forms a capacitive pick up towards the conductor 10. In FIG. 3, the capacitor electrode is provided with rounded ends. This design, avoiding sharp edges, reduces the possibility of local field concentrations that may result in local partial discharges. The capacitor electrode may also be provided with semi-conductive parts to avoid such local field concentrations. Avoidance of local field concentrations is particularly important in high voltage applications and for cables provided with semi-conductive layers on the underside of the cable screen. The capacitive coupler 40 is provided with an insulating part 41 and arranged in an insulated housing also including an electronics box 57. A flexible conductor 44 connects the hemi-cylindrical metal plate to an input filter of the electronic detection system in the electronics box 57.

Figures 4A, 4B:
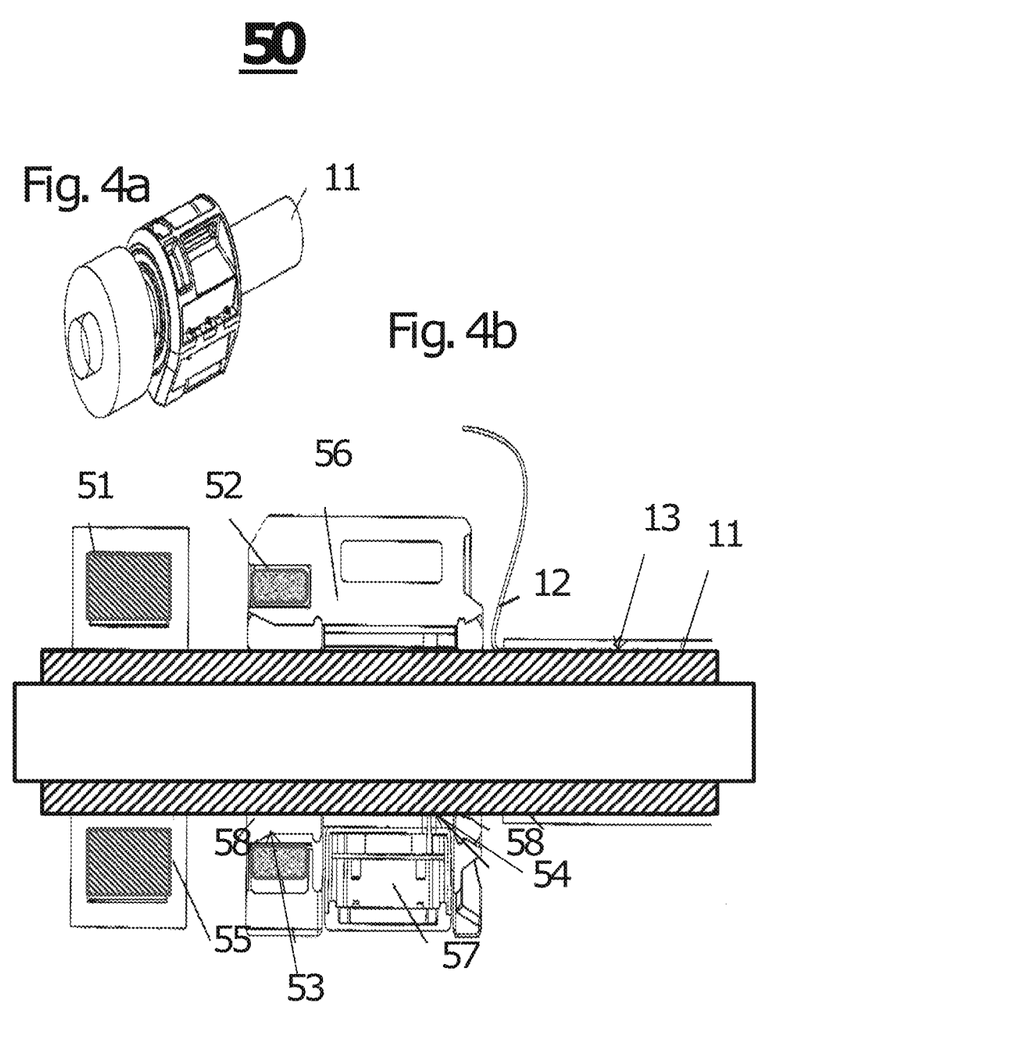

An embodiment of a coupler arrangement is illustrated in FIG. 4a-b. As illustrated in FIG. 4a, the coupler arrangement 50 is clamped around the electric cable 1 on the outside of the cable insulation 11. The electric cable 1 has a cable insulation 11 provided with a cable screen 12 and outer sheath 13, and the cable screen and outer sheath are removed before clamping the coupler arrangement around the electric cable. The removed part of the cable screen is shown in a bent away position in FIG. 4b for illustration purposes. A sectional view showing only the main components of the inductive sensor 52, the capacitive sensor 54 and the inductive injector 51 of the coupler arrangement 50 from FIG. 4a is shown in FIG. 4b. As can be seen from FIG. 4b, the inductive coupler 51 (inductive injector) is arranged at a distance from the inductive pick-up (sensor) 52 for the measurement of the current flowing in the cable and the capacitive pick-up (sensor) 54 for measurement of the line voltage from the magnetic field close to the electric cable insulation. The inductive coupler 51 for injecting test signals into the cable may, as explained above, inject the test signals into the cable in a position other than the measurement point on the cable and may be a separate component from the coupler arrangement.

The inductive pick-up device in the coupler arrangement in FIG. 4*a*-*b*, is based on the inductive coupler principle as described above for FIG. 2 and the capacitive pick-up device is based on the capacitive coupler principle from FIG. 3. The inductive pick-up device in FIG. 4*b* is electrically shielded from the cable with a grounded static screen 53. The inductive sensor measures the magnetic nearfield of the cable, and the use of a grounded static screen 53 reduces the error signal related to the electric nearfield. The electronic detection system for signal filtering and/or signal conditioning is provided inside an electronics box 57.

The inductive sensor 52 and the capacitive sensor 54 are arranged inside a sensor housing. The inductive injector 51 is arranged inside an injector housing. The coupler arrangement in FIG. 4*b* is insulated and adapted to high voltage systems and the inductive signal injector, the inductive sensor and the capacitive sensor may all may operate with full power on the cable.

The coupler arrangement 50 in FIG. 4*b* is clamped around the electric cable insulation in close contact with the cable insulation. As the coupler arrangement is firmly clamped around the cable insulation, a stable geometry both for the inductive sensor and the capacitive sensor in view of the cable geometry is thereby achieved. A stable geometry improves measurement stability and increased measurement sensitivity. A protective insulation (58) is provided on the inside of the coupler arrangement. The thickness of the insulation may be adjusted depending on the cable dimension and the magnitude of the electric and magnetic nearfield to be measured to ensure the sensors are close enough to the electric cable in order to achieve adequate signal strength from the nearfield. A stabile geometry may also be achieved in applications where the current and voltage sensors are arranged at a distance from the cable.

Figure 5:
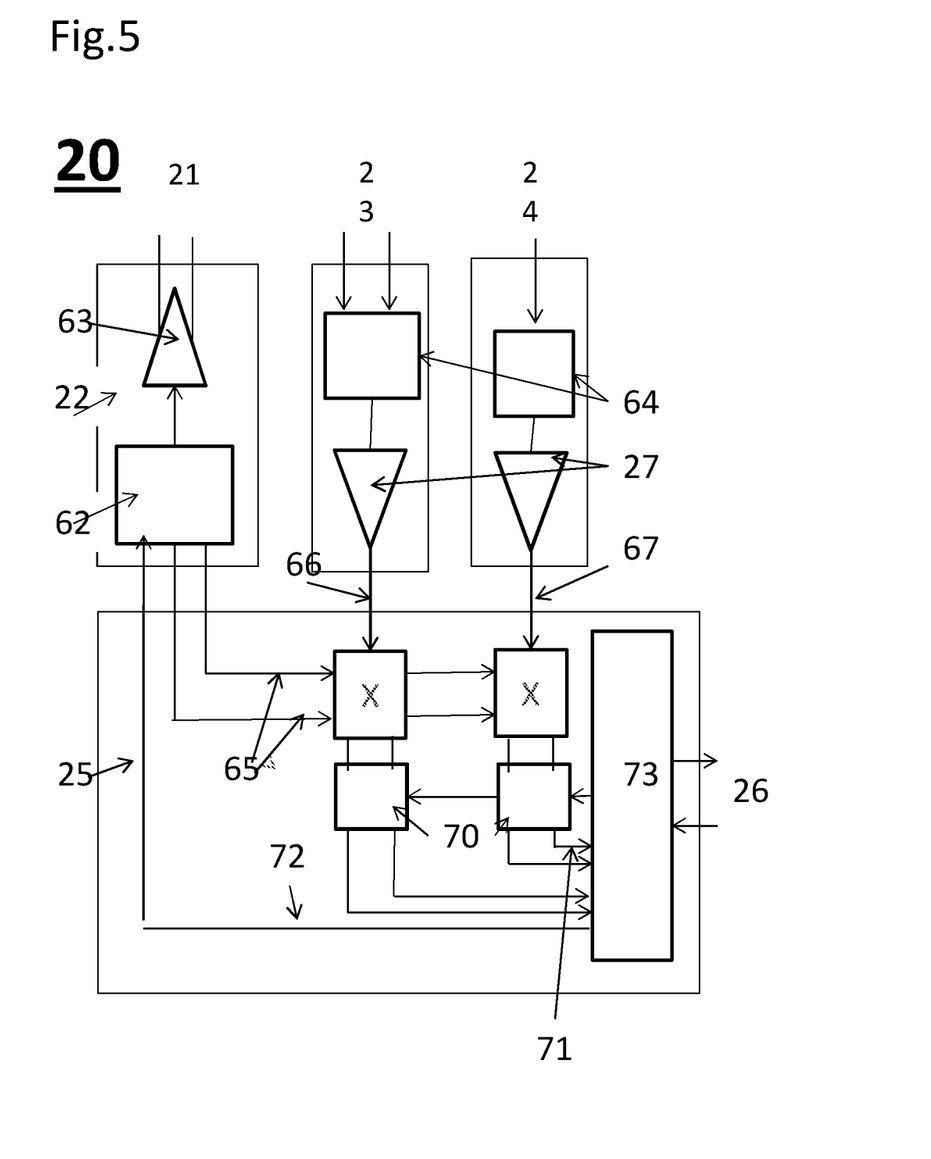
FIG. 5 is a simplified electronic block diagram of the electronic components of the signal generator and the current and voltage sensors of a coupler arrangement.

An embodiment of block diagram of the electronic detection system of the coupler arrangement is shown in FIG. 5. An oscillator 62 with a power amplifier 63 is driving the signal coupler 21 inducing test signals into the electric cable. The oscillator frequency and thus the frequency of the test signal, may be varied over a large range. The test signal frequency or range of frequencies, are adapted to the monitoring purpose and cable properties, such as length. The oscillator frequency may be controlled by an external computer, analyser or controller and input to the oscillator 62 through a signal frequency command 72. The signal from the current sensor is filtered 64 for the power line frequency, amplified 27 and fed to the synchronous detector 25. Correspondingly, the signal from the voltage sensor is also filtered 64 and amplified 27 before the resulting signal is synchronously detected. The power line frequency is normally 50 or 60 Hz. The reference frequency 65 for the detection of the signals from the current sensor and the voltage sensor comes from the oscillator 62 as an in-phase (I) and a quadrature (Q) signal in the form of sine or square waves with a 90° offset. The signals 66, 67 from the sensors 23, 24 and the in-phase (I) and quadrature (Q) reference signals 65 are multiplied in corresponding multipliers (X) 68. The multiplication products (X) of the signals 66, 67 from the sensors and the in-phase (I) and quadrature (Q) references are integrated in corresponding integrators (Int) 70 using an integration time T equal to a whole number of signal periods of the test signal. The synchronous detection explained above may be performed by analogue components or digitally in a signal processor. Finally, the in-phase and quadrature measurement signals output 71 from the integrators 70 are transmitted 73 to a computer 26 for further analysis. The computer may also be e.g. an analyser, a cable monitoring system (e.g. LIRA system or Partial Discharge (PD) signal analyser.

If the monitoring system is the LIRA system, the in-phase and quadrature signals output from the synchronous detector 25 are sent to the computer 26 for calculation of line impedance and analysis of errors as discussed in U.S. Pat. No. 7,966,137 B2 and WO 2014/065674 A1.

The method for cable condition monitoring of an electric cable may also be implemented by coupler arrangements connected to a commercially available high voltage cable connector. FIGS. 6*a*-6*d* illustrate example embodiments of coupler arrangements connected to a commercially available high voltage cable connector.

Figure 6A:
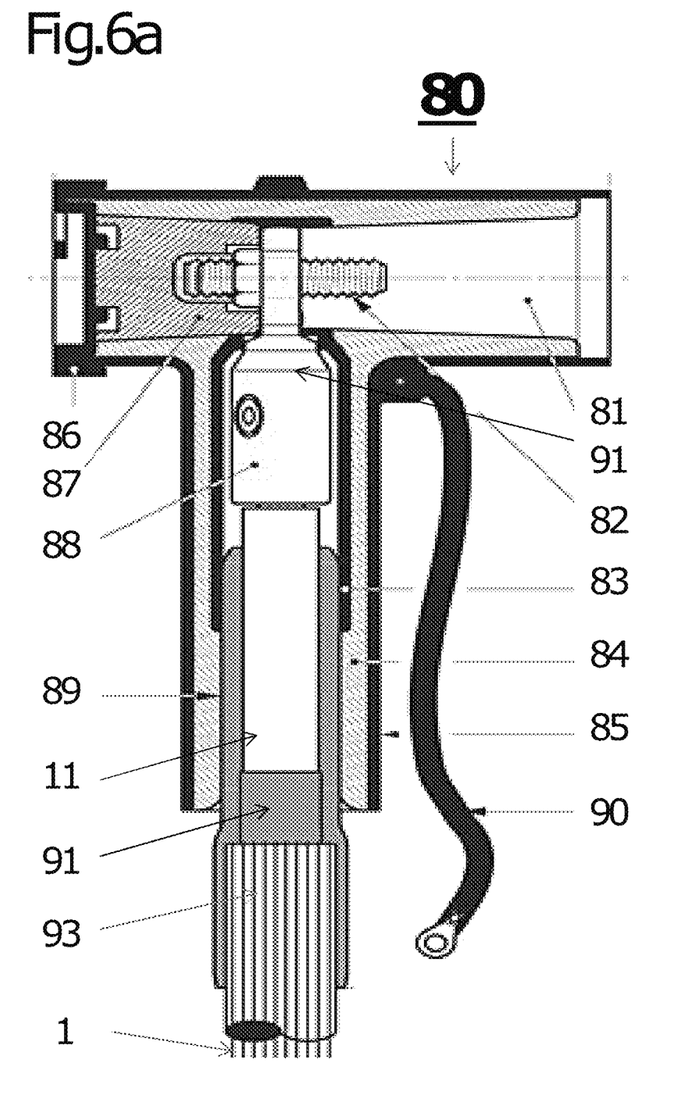
FIG. 6a shows a schematic view of a cross section of the high voltage cable connector.

FIG. 6*a* shows a schematic view of a cross section of a high voltage cable connector 80 connected to an electric cable 1. The high voltage cable connector has a connecting structure 91 with a male part adapted to be arranged on an electric cable termination. The high voltage cable connector has a connection area 81 and a bolt 82 holding the male part of the connected structure in place on the electric cable termination. An area on the high voltage cable connector 80, suitable for connecting an injection capacitor of a coupler arrangement, is sealed with a packer 87 and a fixing lid 86. The connecting structure 91 is provided with a crimp terminal 88 applied to the electric cable conductor end. The electric cable isolation 11 starts directly after the crimp connector 88. An additional insulation sleeve 89 is provided on the outside of the electric cable isolation 11. The high voltage cable connector 80 has a connector housing 92 on the outside of the connecting structure 91 and further extending over the outside of the additional insulation sleeve 89. The connector housing 92 has an inner semiconductive layer 83 followed by an insulating layer 84 and an outer semiconductive layer 85. The inner semiconductive layer 83 partly covers the additional insulation sleeve 89 when arranged on the electric cable termination. Accordingly, the insulating layer 84 is also exposed to parts of the additional insulation sleeve 89 as shown in FIG. 6*a*. The outer semiconducting layer 85 is connected to system ground 69 with a cable 90. The cable shield 93 is folded back and connected to system ground 69. The high voltage cable connector 80 is firmly connected to the electric cable termination to ensure good electrical contact between the bolt 82 and the electric cable conductor and tight fitting between the connector housing 92, the additional cable insulation sleeve 89 and the inner cable screen 12.

Figure 6B:
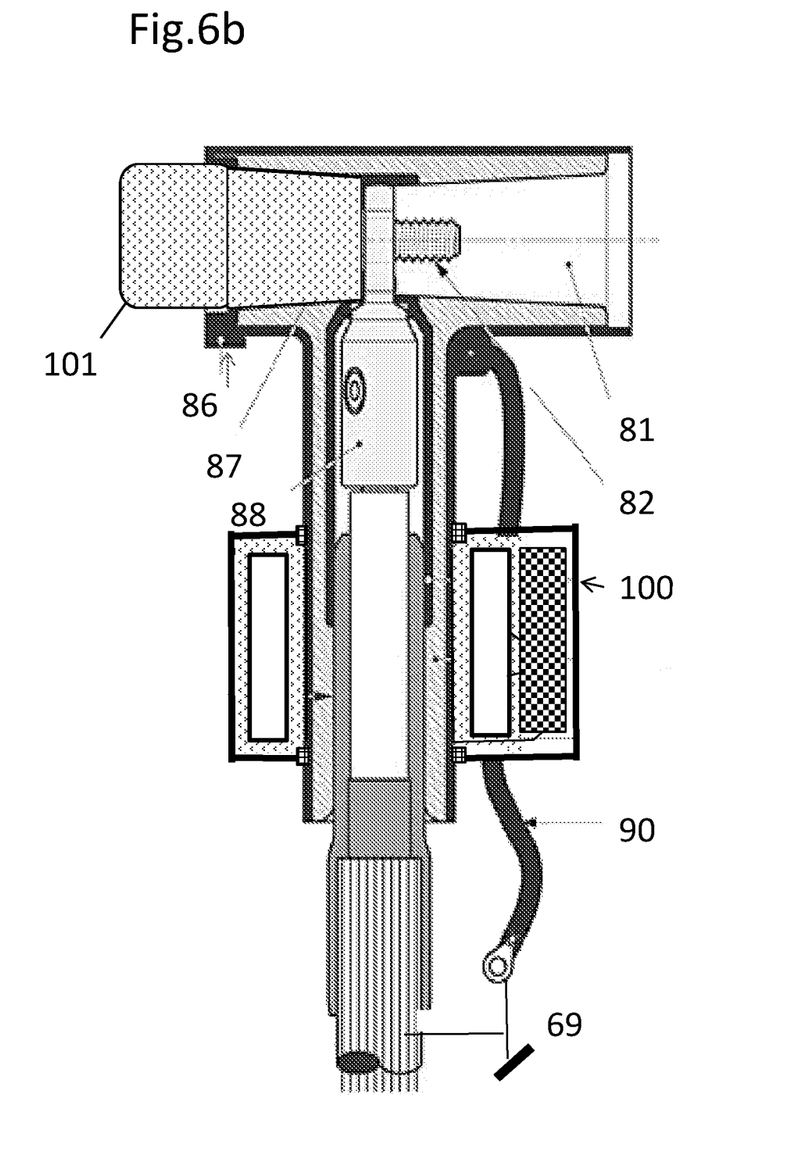
FIG. 6b shows a schematic view of a cross section of the high voltage cable connector from FIG. 6a provided with an embodiment of a coupler arrangement with a sensor assembly and a capacitive injector.
Figure 6C:
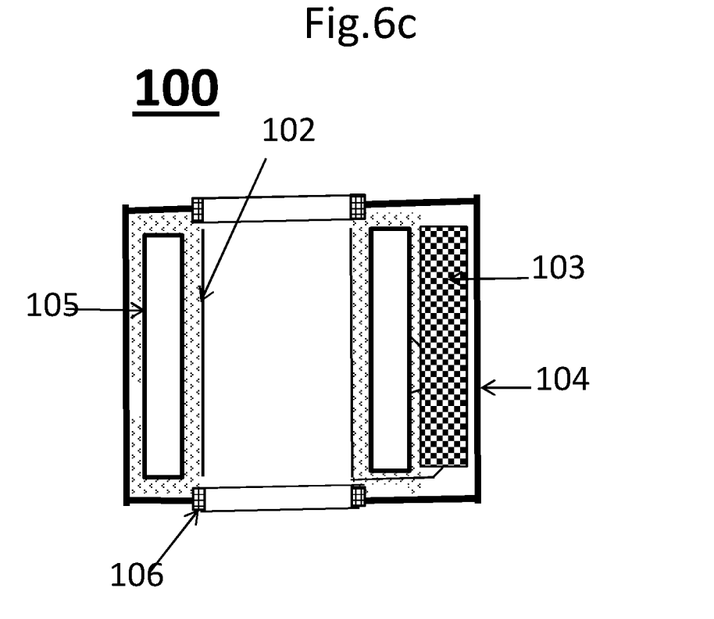
FIG. 6c shows the sensor assembly of the coupler arrangement in FIGS. 6b and 6d.

An embodiment of a coupler arrangement with a sensor assembly and a capacitive injector 101 connected to the high voltage cable connector 80 is shown in FIG. 6*b*. The fixing lid 86 and packer 87 are removed, and an injection capacitor inserted into close contact with the bolt 82. The injection capacitor comprises a high voltage capacitor and may include safety devices and frequency shaping circuits. A sensor assembly 100 is closely fitted around or partly around the connector housing 92. FIG. 6*c* illustrates in a cross sectional view the sensor assembly 100. The sensor assembly 100 comprises a capacitive sensor plate 102 and a pick-up coil 105, both connected to the electronics 103. The pick-up coil 105 is in the embodiment in FIG. 6*c* a Rogowski coil, but other pick-up coils may also be used. The electronics 103 may be as described above and shown in FIG. 5. The capacitive sensor plate 102 is cylindrical, covering at least a part of the periphery of the connector housing 92 above the additional insulation sleeve 89. The capacitive sensor plate 102 is in electrical contact with the outer semiconducting layer 85. Isolation rings 106 on the top and bottom of the sensor assembly 100 isolate the grounded sensor assembly housing 104 from the outer semiconducting layer 85.

Figure 6D:
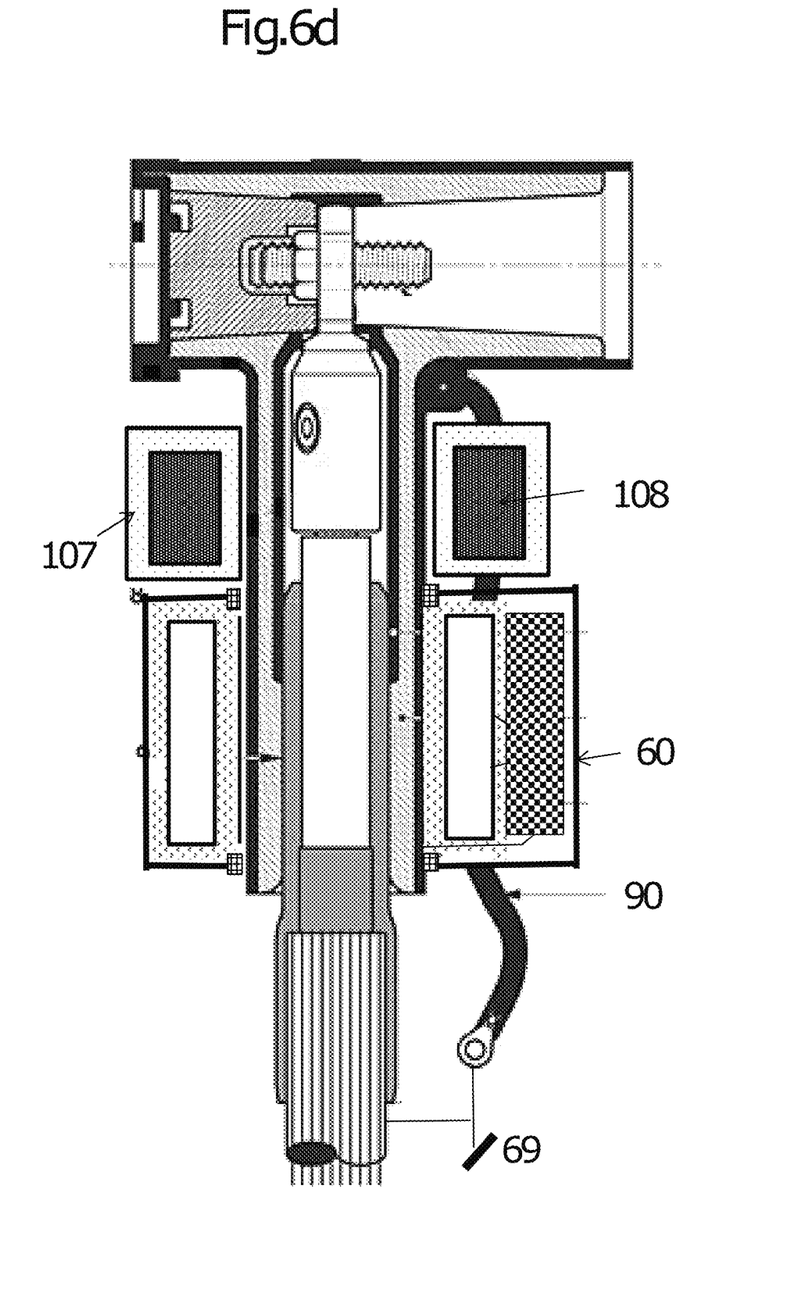
FIG. 6d shows a schematic view of a cross section of the high voltage cable connector from FIG. 6a provided with an embodiment of a coupler arrangement with a sensor assembly and an inductive injector.

An embodiment of a coupler arrangement with a sensor assembly 100 and an inductive injector connected to the high voltage cable connector 80 is shown in FIG. 6d. The sensor assembly 100 is as described above for FIG. 6b and FIG. 6c. The injector for injecting the reference signal into the electric cable is in the embodiment in FIG. 6d an injection coil 108. The injector is at least partly arranged around the connector housing 92. The injector is in FIG. 6d arranged partly over the area provided with the crimp terminal 88, but other positions are also possible as long as the test signal may be injected into the electric cable.

The coupler arrangement may be powered externally via cables or alternatively with a built in battery. The built in battery could be charged from the magnetic field of the cable using the signal coupler 21 in periods when the system is not doing measurements. The communication with the computer may be done with electric cables, fibre optic cables or as digital wireless radio communication. Use of fibre optic cables or digital wireless radio communication will increase safety and reduce electric power line noise in the computer and signal electronics.

Having described preferred embodiments of the invention it will be apparent to those skilled in the art that other embodiments incorporating the concepts may be used. These and other examples of the invention illustrated above are intended by way of example only and the actual scope of the invention is to be determined from the following claims.

The invention claimed is:

1. A method for cable condition monitoring of an electric cable, the method comprising:
    inducing a test current in the electric cable;
    measuring a resulting current in a measurement point of the electric cable by measuring a magnetic nearfield of the electric cable caused by the test current;
    measuring a resulting voltage in the measurement point of the electric cable by measuring an electric nearfield of the cable caused by the test current;
    calculating an impedance of the electric cable based on the resulting current and the resulting voltage by a line resonance analysis system; and
    analyzing the impedance by the line resonance analysis system to establish a condition of the electric cable.

2. The method according to claim 1, further comprising measuring the electric nearfield using a capacitive sensor.

3. The method according to claim 2, further comprising synchronously detecting the output from the inductive sensor and the output from the capacitive sensor.

4. The method according to claim 3, further comprising filtering the output from the inductive sensor and the output from the capacitive sensor for the power line frequency of the electric cable, before performing amplification and synchronous detection.

5. The method according to claim 3, further comprising amplifying the output from the inductive sensor and the output from the capacitive sensor before performing synchronous detection.

6. The method according to claim 2, further comprising clamping the inductive sensor and the capacitive sensor to the electric cable.

7. The method according to claim 1, further comprising measuring the magnetic nearfield using an inductive sensor.

8. The method according to claim 7, further comprising shielding the inductive sensor from the electric nearfield of the electric cable.

9. The method according to claim 1, further comprising using an inductive coupler for inducing a test current in the electric cable.

10. The method according to claim 1, further comprising using a capacitive coupler for inducing a test current in the electric cable.

11. The method according to claim 1, further comprising measuring the magnetic nearfield using a solid-state sensor.

12. The method according to claim 1, further comprising measuring the magnetic nearfield using a remotely arranged sensor.

13. The method according to claim 1, further comprising calculating a complex impedance of the electric cable based on the measured resulting current and the measured resulting voltage.

14. The method according to claim 1, wherein the electric cable is a powered (live) or unpowered electric cable.

15. Use of the method according to claim 1 for measuring noise from an electric cable or use of a coupler arrangement for measuring noise from an electric cable,
    wherein the coupler arrangement is for electric cable condition monitoring, the coupler arrangement being adapted to connect an electric cable condition monitoring system to an electric cable to be monitored, where the electric cable condition monitoring system is a line resonance analysis system based on impedance measurements of the electric cable,
    the coupler arrangement comprising:
    a first sensor for measuring a current in a measurement point of the electric cable by measuring a magnetic nearfield of the electric cable; and
    a second sensor for measuring a voltage in the measurement point of the electric cable by measuring an electric nearfield of the electric cable.

16. A coupler arrangement for electric cable condition monitoring, where the coupler arrangement is adapted to connect an electric cable condition monitoring system to an electric cable to be monitored, where the electric cable condition monitoring system is a line resonance analysis system based on impedance measurements of the electric cable,
    the coupler arrangement comprising:
    a first sensor for measuring a current in a measurement point of the electric cable by measuring a magnetic nearfield of the electric cable caused by a test current induced in the electric cable; and
    a second sensor for measuring a voltage in the measurement point of the electric cable by measuring an electric nearfield of the electric cable caused by a test current induced in the electric cable.

17. The coupler arrangement according to claim 16, wherein the first sensor is an inductive sensor.

18. The coupler arrangement according to claim 17, where the inductive sensor comprises a transformer.

19. The coupler arrangement according to claim 16, wherein the first sensor is electrically shielded from the electric nearfield of the electric cable.

20. The coupler arrangement according to claim 17, wherein the inductive sensor comprises a static screen electrically shielding the inductive sensor from the electric nearfield of the electric cable.

21. The coupler arrangement according to claim 16, wherein the second sensor is a capacitive sensor.

22. The coupler arrangement according to claim 21, wherein the capacitive sensor comprising an insulated capacitor electrode designed to avoid local partial discharges.

23. The coupler arrangement according to claim 22, wherein the insulated capacitor electrode is adapted for contact with the electric cable insulation in at least a part of a circumference of the electric cable.

24. The coupler arrangement according to claim 16, wherein the first sensor is arranged at a distance from the electric cable.

25. The coupler arrangement according to claim 16, further comprising a signal coupler for inducing a test current in the electric cable.

26. The coupler arrangement according to claim 25, wherein the signal coupler is an inductive coupler.

27. The coupler arrangement according to claim 25, wherein the signal coupler is a capacitive coupler.

28. The coupler arrangement according to claim 16, where the coupler arrangement is adapted for clamping to the electric cable.

29. The coupler arrangement according to claim 28, where an inside of the coupler arrangement is adapted for contact with the cable insulation or a semi-conductive layer on the cable insulation.

30. A method for measuring an impedance of an electric cable comprising detecting a nearfield of the electric cable by use of a non-galvanic connection to the electric cable, wherein the method further comprises:
inducing a test current in the electric cable;
measuring a resulting current in a measurement point of the electric cable by measuring a magnetic nearfield of the electric cable caused by the test current;
measuring a resulting voltage in the measurement point of the electric cable by measuring an electric nearfield of the cable caused by the test current;
and
calculating an impedance of the electric cable based on the detected nearfields from the electric cable.

* * * * *